(12) United States Patent
Lin

(10) Patent No.: US 11,526,202 B2
(45) Date of Patent: Dec. 13, 2022

(54) METHOD OF CHECKING NORMAL POWER INPUT AND LOAD OF PROGRAMMABLE AC POWER DISTRIBUTOR AT POWER-ON STATE BY LIGHT SIGNAL

(71) Applicant: Chyng Hong Electronic Co., Ltd., Taichung (TW)

(72) Inventor: Mu-Chun Lin, Taichung (TW)

(73) Assignee: CHYNG HONG ELECTRIC CO., LTD., Taichung (TW)

( * ) Notice: Subject to any disclaimer, the term of this patent is extended or adjusted under 35 U.S.C. 154(b) by 288 days.

(21) Appl. No.: 17/063,361

(22) Filed: Oct. 5, 2020

(65) Prior Publication Data

US 2022/0107676 A1 Apr. 7, 2022

(51) Int. Cl.
| | | |
|---|---|---|
| *G06F 1/28* | (2006.01) | |
| *G01R 19/25* | (2006.01) | |
| *G06F 1/18* | (2006.01) | |
| *H01H 13/02* | (2006.01) | |
| *H02B 1/24* | (2006.01) | |
| *H05K 7/14* | (2006.01) | |
| *G01R 21/00* | (2006.01) | |
| *G01R 21/06* | (2006.01) | |
| *H05K 5/00* | (2006.01) | |

(52) U.S. Cl.
CPC ........... *G06F 1/28* (2013.01); *G01R 19/2513* (2013.01); *G06F 1/189* (2013.01); *H01H 13/023* (2013.01); *H02B 1/24* (2013.01); *G01R 21/006* (2013.01); *G01R 21/06* (2013.01); *H05K 5/0017* (2013.01); *H05K 7/1432* (2013.01)

(58) Field of Classification Search
CPC .. G01R 19/2513; G01R 21/006; G01R 21/06; G06F 1/189; G06F 1/28; H01H 13/023; H02B 1/24; H05K 5/0017; H05K 7/1432
See application file for complete search history.

(56) References Cited

U.S. PATENT DOCUMENTS

| | | | |
|---|---|---|---|
| 10,063,038 B1 | 8/2018 | Lin | |
| 2013/0212419 A1* | 8/2013 | Hilburn | G06F 1/3203 713/340 |
| 2018/0196098 A1* | 7/2018 | Ferguson | H02H 3/042 |
| 2021/0071831 A1* | 3/2021 | Skorjanec | G06F 1/28 |

* cited by examiner

*Primary Examiner* — Terrell S Johnson
(74) *Attorney, Agent, or Firm* — Sinorica LLC

(57) ABSTRACT

In a method of checking normal input power and load of a programmable AC power distributor in its power-on state, indicator lights are installed in an output ON button and an output OFF button. During power ON, a master switch is switched to an ON position to detect the input power and obtain a detection result through a change of the indicator light in the output OFF button, and then the output ON button is pressed to check the power-on state of the load and obtain a detection result by outputting the change of the indicator light of the button. Therefore, users can instantly know whether the input power and load are in a normal state during the operation of turning on the power distributor, and this method makes the operation of the power distributor safer and more convenient, and ensures a high quality of power supply.

5 Claims, 5 Drawing Sheets

METHOD OF CHECKING NORMAL POWER INPUT AND LOAD OF PROGRAMMABLE AC POWER DISTRIBUTOR AT POWER-ON STATE BY LIGHT SIGNAL

FIELD OF THE INVENTION

The present invention relates to a power distributor, and more particularly to a method provided for users to easily check whether or not the power input and load of a programmable AC power distributor at a power-on state are normal by a light signal.

BACKGROUND OF THE INVENTION

In response to the "computerization and digital and smart transformations" occurring across manufacturing industries and promoted by the Industry 4.0, the inventor of the present invention invented a programmable AC power distributor with U.S. patent Ser. No. 10/063,038, and such AC power distributor is capable of monitoring and controlling various data of the input power and automatically controlling the ON/OFF of power distribution to overcome the issues arose from the power management and monitoring by manual detection, so as to improve the quality of power and the safety of power management. To ensure the operation safety and the normal power supply, users often have to check whether or not the state of the input power and the output load when turning on the power distributor. In view of the deficiency of the conventional programmable AC power distributor, the inventor of the invention believes that it is necessary to further improve the conventional programmable AC power distributor, and thus providing a method in accordance with the present invention to overcome the deficiency of the prior art.

SUMMARY OF THE INVENTION

It is a primary objective of the present invention to provide a method of checking normal input power and load of a programmable AC power distributor at a power-on state by the display of a light signal, and the method uses the change of the light signal to let users know about the power-on state of the input power and the output load instantly during the operation process of the programmable AC power distributor, so as to make the operation of the programmable AC power distributor more convenient and practical.

To achieve the aforementioned and other objectives, the present invention discloses a method provided for users to easily check whether or not an input power and a load of a programmable AC power distributor at a power-on state are normal by the display of a light signal, and the method comprises the steps of:

S1: providing a master switch, an output ON button and an output OFF button, wherein the master switch is coupled to an input power and uses as a switch of the input power, and the output ON button is provided for turning on a switch of an output load, and the output OFF button is provided for turning off the switch of the output load, and each of the output ON button and the output OFF button has an indicator light;

S2: providing a current detector and a network connection and power parameters measuring circuit board for detecting a power-on state of the input power and the output load, wherein the network connection and power parameters measuring circuit board can drive indicator light of the output ON button or the indicator light of the output OFF button to operate and function;

S3: detecting whether or not the input power is normal, wherein the output OFF button is pressed, so that the network connection and power parameters measuring circuit board performs a voltage detection of an external input power, while driving the indicator light in the output OFF button into a blinking state, and if the network connection and power parameters measuring circuit board completes the voltage detection of the external input power and the input power is normal, then the indicator light in the output OFF button will be situated in a constant light state and the output ON button will be able to operate and function, or else the indicator light in the output OFF button will be situated in a blinking state and the output ON button will be unable to operate and function; and S4: detecting whether or not the output load at a power-on state is normal, wherein the output ON button is pressed, so that the current detector performs a current detection of an external output load at the power-on state, and whenever the switch of one of the loads is turned on and the starting current of the load is normal, then the indicator light of the output ON button will blink once, and if the switches of all loads are turned on, then the indicator light in the output ON button will be situated in a constant light state, and if there is a switch of the load cannot complete the power-on correctly, then the indicator light in the output ON button will blink continuously.

The method of the present invention has the indicator lights installed inside the output ON button and the output OFF button respectively. During the process of turning on the programmable AC power distributor, a master switch is switched to an ON position to detect the input power, and the indicator light of the output OFF button indicates the detection state, and then the output ON button is pressed to detect the output load, and the indicator light of the output ON button shows the detection state, so that users can know about the power-on state of the input power and the output load instantly during the process of turning on the power distributor, so as to make the operation of the power distributor more convenient, more smoothly and safer and ensure the quality and safety of power supply.

DESCRIPTION OF THE PREFERRED EMBODIMENTS

The objectives, technical characteristics and effects of the present invention will become apparent with the detailed description of preferred embodiments accompanied with the illustration of related drawings. It is intended that the embodiments and drawings disclosed herein are to be considered illustrative rather than restrictive.

Figure 1:
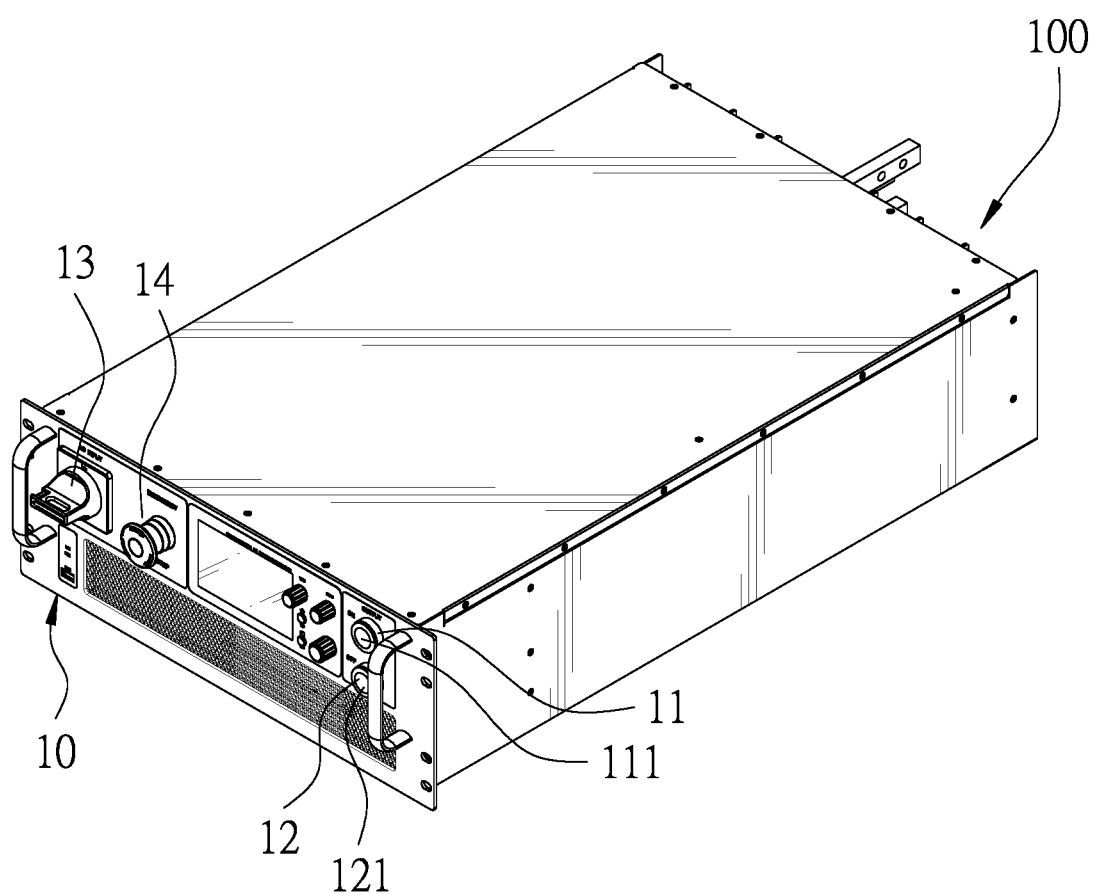
FIG. 1 is a perspective view of a programmable AC power distributor of the present invention.
Figure 2:
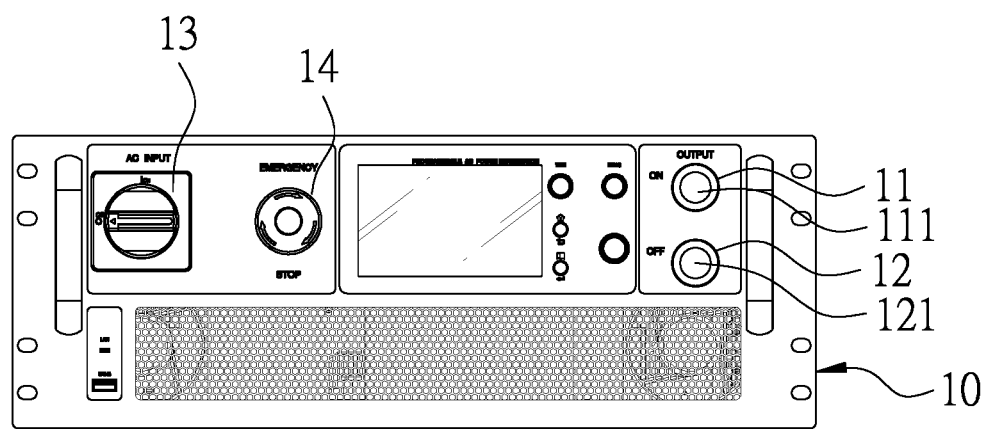
FIG. 2 is a front view of a panel of a programmable AC power distributor of the present invention.

The present invention is directed to a method provided for users to easily check the power-on state of an input power and the power-on state of a load of a programmable AC power distributor at a power-on state are normal by the display of a light signal, and the method comprises the following steps (S1~S4):

S1: A master switch, an output ON button and an output OFF button are provided. With reference to FIGS. 1 and 2 for a perspective view of a programmable AC power distributor and a front view of a panel of the programmable AC power distributor in accordance with the present invention respectively, a panel 10 is installed at the front of a power distributor 100, and the panel 10 has an output ON button 11 and an output OFF button 12 installed thereon, and the output ON button 11 is provided for turning on a switch coupled to an output load 300, and the output OFF button 20 is provided for turning off the switch coupled to the output load 300, and the switches can be electromagnetic switches or contactless switches. In this embodiment, the switches are electromagnetic switches 30, and the output ON button 11 has an indicator light 111 installed therein, and the output OFF button 12 also has an indicator light 121 installed therein, wherein the indicator light 121 of the output OFF button 12 is red, and the indicator light 111 of the output ON button 11 is green, and the panel 10 has a master switch 13 and an emergency switch 14 installed thereon, and the master switch 13 is a rotary switch coupled to an input power 200 and provided for turning on/off an input power 200, and the emergency switch 14 is a pushbutton switch provided for turning off the input power 200 during emergency, and the power distributor 100 has a power converter 15 for supplying a low-voltage AC power for the panel 10 and other devices.

Figure 3:
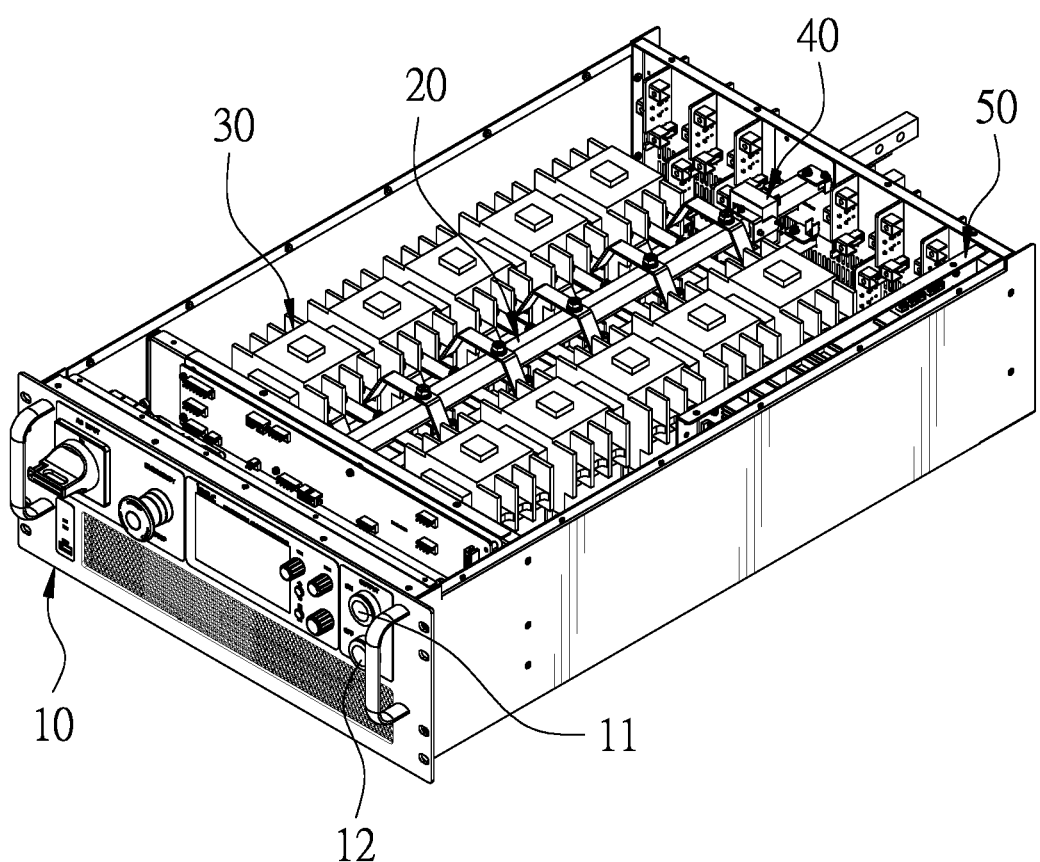
FIG. 3 is a perspective view showing the interior of a programmable AC power distributor the present invention.
Figure 4:
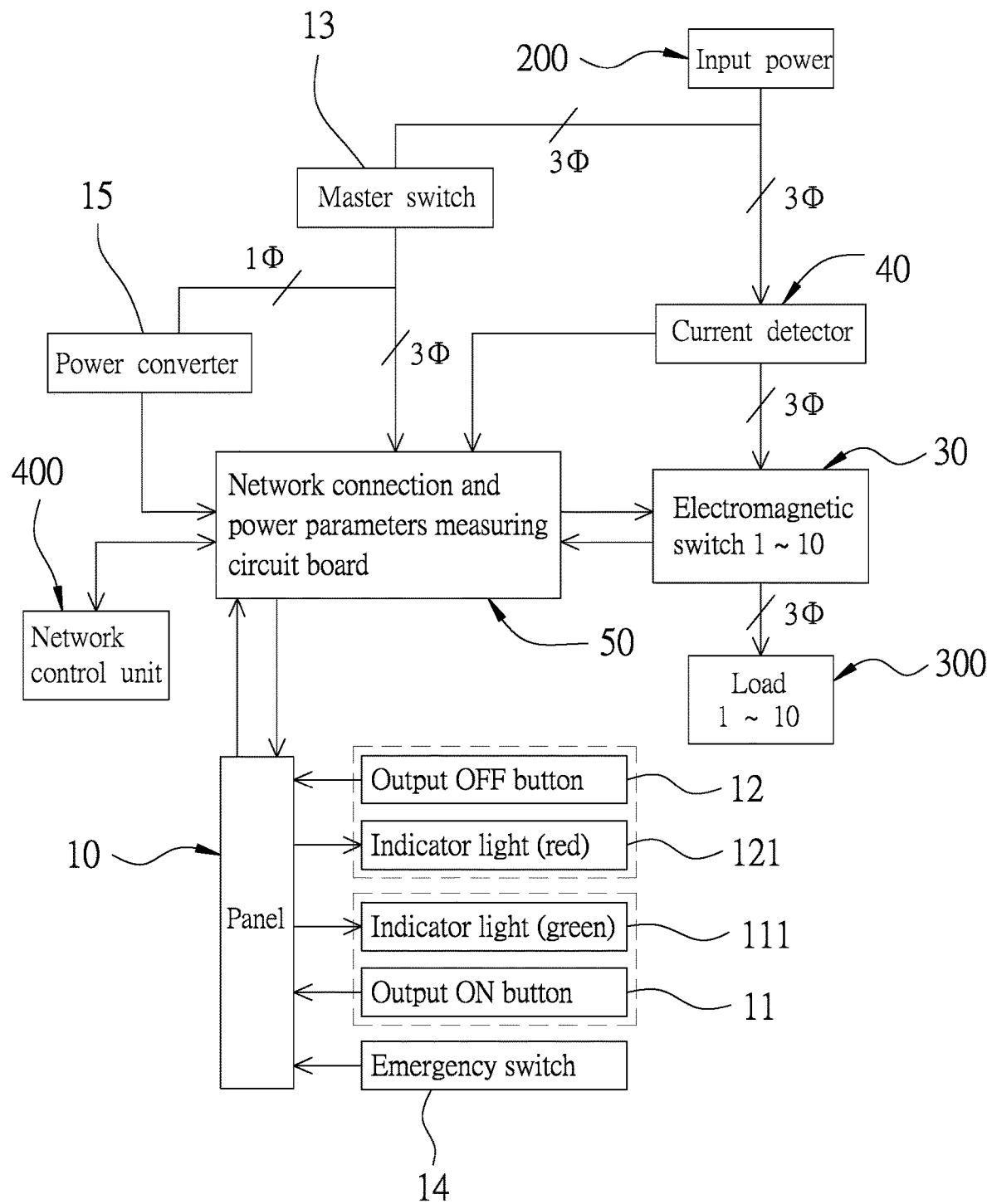
FIG. 4 is a block diagram of the present invention.

S2: A current detector and a network connection and power parameters measuring circuit board are provided. With reference to FIGS. 3 and 4 for a perspective view showing the interior of the programmable AC power distributor and a block diagram of the programmable AC power distributor in accordance with the present invention respectively, the power distributor 100 has a plurality of buses 20 installed therein. Since the input power of the power distributor 100 is a three-phase AC power, therefore there are three buses 20, and both sides of the buses 20 have the electromagnetic switches 30. In this embodiment, there are ten electromagnetic switches 30 externally connectable to ten loads 300, and each of the buses 20 has a current detector 40 for detecting a current. In this embodiment, the current detector 40 is a current transformer, and a network connection and power parameters measuring circuit board 50 is installed on a side of the power distributor 100 and coupled to the master switch 13 for detecting voltage, frequency and phase, and the network connection and power parameters measuring circuit board 50 is electrically coupled to the panel 10, the current detector 40 and the electromagnetic switches 30. Since power is equal to the product of voltage and current, therefore the rated current of each load can be calculated after the voltage value of the input power is detected and obtained. After the measured current is loaded and compared with its rated current, we can know whether or not the consumption of current of the load is normal, or even calculate the power factor, power consumption and carbon emission. Further, the network connection and power parameters measuring circuit board 50 can drive the indicator light 111 of the output ON button 11 or the indicator light 121 of the output OFF button 12 through the panel 10 to operate the indicator lights 111, 121. In addition, the network connection and power parameters measuring circuit board 50 is connectable to a network control unit 400 for the purpose of remote control.

S3: A detection step is performed to detect whether or not an input power at the power-on state is normal. Firstly, the master switch 13 is switched to an ON position, such that the network connection and power parameters measuring circuit board 50 detects the voltage, frequency and phase of the input power 200. In the meantime, the indicator light 121 of the output OFF button 12 indicates a blinking state. If the input power is normal after the current detector 40 has completed the detection of the input power 200, then the indicator light 121 of the output OFF button 12 will indicate a constant light state, and the output ON button 11 will be able to exercise its function, or else the indicator light 121 of the output OFF button 12 will maintain a continuous blinking state, and the output ON button 11 will be unable to exercise its function.

S4: A detection step is performed to detect whether or not a load at the power-on state is normal. The output ON button 11 is pressed, such that the current detector 40 detects the current of an external output load 300 at a power-on state, and if the electromagnetic switch 30 of one of the loads 300 is turned on, and the starting current of the load 300 is normal, then the indicator light 111 of the output ON button 11 will blink once. In this invention, the indicator light 111 of the output ON button 11 will blink sequentially according to the power-on sequence of the loads 300, and if the electromagnetic switches 30 of all output loads 300 are turned on, the indicator light 111 in the output ON button 11 will be in a constant light state, and if there is a load 300 with abnormal current making the electromagnetic switch 30 to be unable to complete the power-on, then the indicator light 111 in the output ON button 11 will be in a continuous blinking state which serves as a warning.

To further explain the structural characteristics, technical measures, and expected effects of the present invention, the operating method of the present invention will be described in details below.

Figure 5:
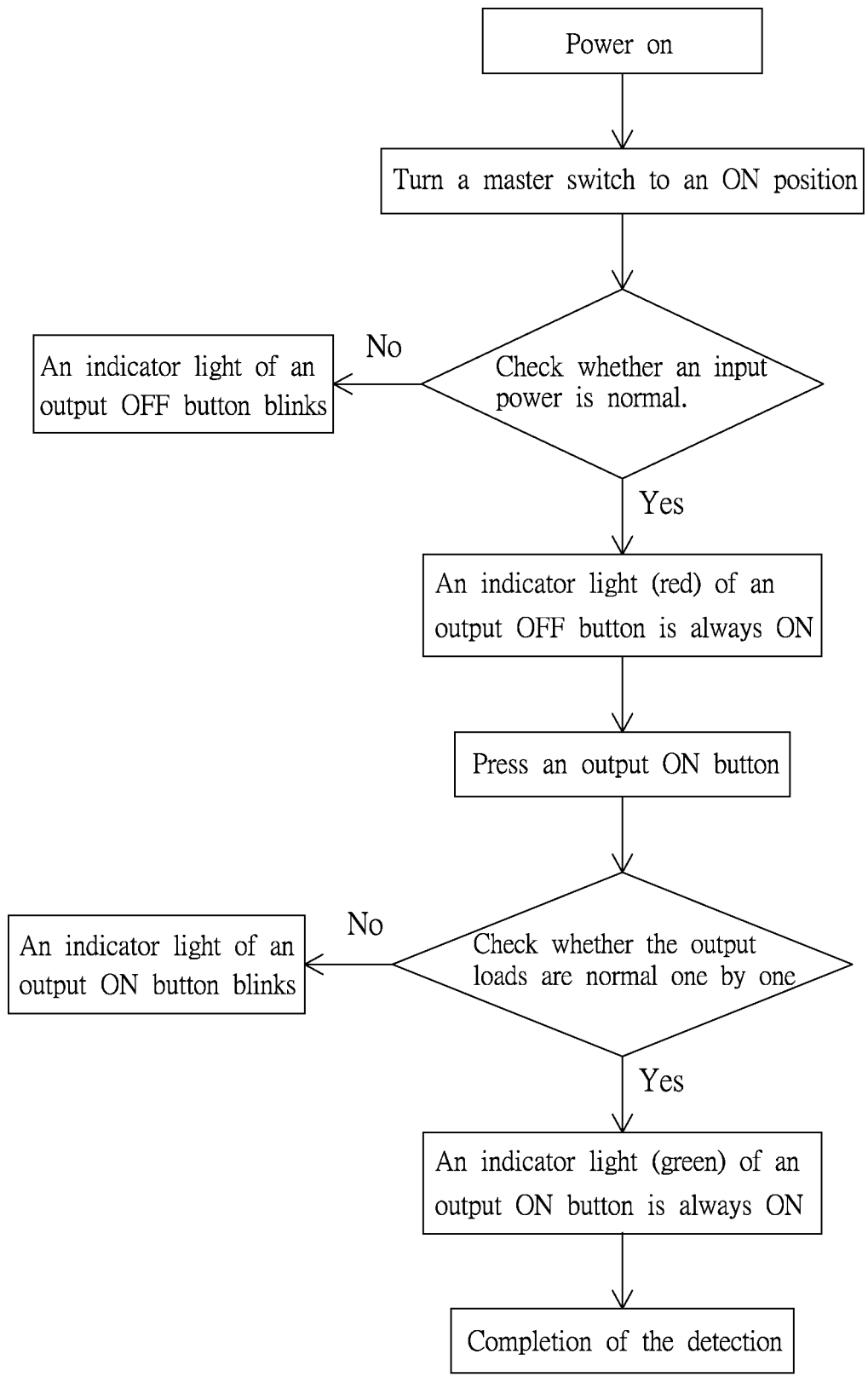
FIG. 5 is a flow chart of the present invention.

With reference to FIG. 5 for a flow chart of the present invention, after an operator switches the master switch 13 of the power distributor 100 to the ON position, the network connection and power parameters measuring circuit board 50 will check whether or not the voltage, frequency and phase of the input power are normal. During the detection process, the indicator light 121 of the output OFF button 12 is situated in a constant blinking red light status. After the normal input voltage is confirmed, the indicator light 121 of the output OFF button 12 is situated in a constant red light status, and the output ON button 11 can operate and function. On the other hand, if the input voltage is abnormal, then the indicator light 121 of the output OFF button 12 will be in a continuous blinking red light status, and the output ON button 11 will be unable to operate or function, so that the operator can easily and clearly confirm whether or not the input power is normal by visually observing a change of the light signal or color of light signal, and the operator can continue the subsequent operation after confirming the normal input power.

If the output ON button 11 is pressed again, the current detector 40 will detect whether or not the total current is normal, so that the electromagnetic switch 30 coupled to the load 300 can be turned on sequentially according to a default power-on sequence. In this embodiment, the loads 300 are power supply devices with a master-slave control, and the power-on sequence starts turning on the farthest slave in a far-to-near manner, and finally turns on the master. If one of the electromagnetic switches 30 is turned on and the starting current is normal, then the indicator light 111 of the output ON button 11 will blink a green light once, and then the next load 300 will be detected. The present invention has ten electromagnetic switches 30 coupled to ten loads 300 respectively, so that the indicator light 111 will blink ten times. If the starting currents of all loads 300 are normal, and the electromagnetic switches 30 are turned on, then the indicator light 111 of the output ON button 11 will be in a constant green light status. On the contrary, if the starting current of any one of the electromagnetic switches 30 is abnormal, and the electromagnetic switch 30 cannot complete the power-on, then the indicator light 111 of the output ON button 11 will be in a continuous blinking status. Therefore, the operators can easily and instantly control the power-on status of the load 300 during the process of turning on the power distributor 100 by visually observing the change of the light signal.

On the other hand, if it is necessary to turn off the power of the loads 300, then the operators can press the output OFF button 12, and the indicator light 111 of the output ON button 11 will blink once and the indicator light will also blink once for the power disconnection of each electromagnetic switch 30. Until the power of all electromagnetic switches 30 is disconnected, the indicator light 121 of the output OFF button 12 becomes a constant light state.

The operation method and the effects of the present invention are described below.

1. The present invention makes use of the change and color of the light signal to let the users know whether or not the input power and the output load at the power-on state are normal by visually observing the change of the light signal. In other words, the operators can know the power on status of the input power and the output load instantly during the process of turning on the programmable AC power distributor, so as to make the operation of the power distributor more convenient, more smoothly and safer and ensure the quality and safety of power supply.

2. When the master switch 13 is switched to the ON position to turn on the input power 200, the network connection and power parameters measuring circuit board 50 detects the voltage, frequency and phase of the input power 200 first, so that if there is any abnormal input power 200, the operators can know the situation in advance. In the abnormal situation, the invention also prevents the switch of the load 300 from being turned on or operating in order to protect the load 300, so that the present invention has the function of a protection relay.

3. After the output ON button 11 is pressed, the present invention can calculate the rated current of each load 300 after monitoring the voltage of the input power without changing the rated power (since power is equal to the product of voltage and current). After the measured current detected by the current detector 40 is loaded and compared with its rated current, we can know whether or not the consumption of current of the load is normal, while measuring and determining whether or not there is an overload of power, calculating and determining whether or not the power factor and harmonic factor are normal, and calculating the power consumption and carbon emission. Therefore, the users can fully control the quality of the input power and the power consumption of the load.

While the invention has been described by means of specific embodiments, numerous modifications and variations could be made thereto by those skilled in the art without departing from the scope and spirit of the invention as set forth in the claims.

What is claimed is:

1. A method of checking normal input power and load of a programmable AC power distributor at a power-on state by a light signal, comprising the steps of:
    S1: providing a master switch, an output ON button and an output OFF button, wherein the master switch is coupled to an input power and used as a switch of the input power, and the output ON button is provided for turning on a switch of an output load, and the output OFF button is provided for turning off the switch of the output load, and each of the output ON button and the output OFF button has an indicator light;
    S2: providing a current detector and a network connection and power parameters measuring circuit board for detecting a power-on state of the input power and the output load, wherein the network connection and power parameters measuring circuit board can drive indicator light of the output ON button or the indicator light of the output OFF button to operate;
    S3: detecting whether or not the input power is normal, wherein the master switch is switched to an ON position, so that the network connection and power parameters measuring circuit board performs a voltage detection of an external input power, while driving the indicator light in the output OFF button into a blinking state, and if the network connection and power parameters measuring circuit board completes the voltage detection of the external input power and the input power is normal, then the indicator light in the output OFF button will be situated in a constant light state and the output ON button will be able to operate and function, or else the indicator light in the output OFF button will be situated in a blinking state and the output ON button will be unable to operate and function;
    S4: detecting whether or not the output load at a power-on state is normal, wherein the output ON button is pressed, so that the current detector performs a current detection of an external output load at the power-on state, and whenever the switch of one of the loads is turned on and the starting current of the load is normal, then the indicator light of the output ON button will blink once, and if the switches of all loads are turned on, then the indicator light in the output ON button will be situated in a constant light state, and if there is a switch of the load cannot complete the power-on correctly, then the indicator light in the output ON button will blink continuously.

2. The method of checking normal input power and load of a programmable AC power distributor at a power-on state by a light signal as claimed in claim 1, wherein the switches of the loads are electromagnetic switches.

3. The method of checking normal input power and load of a programmable AC power distributor at a power-on state by a light signal as claimed in claim 1, wherein the indicator light of the output ON button blinks sequentially according to the power-on sequence of the output load of the power distributor.

4. The method of checking normal input power and load of a programmable AC power distributor at a power-on state by a light signal as claimed in claim 1, wherein the output loads are power supply devices with a master-slave control, and the power-on sequence starts turning on the farthest slave in a far-to-near manner, and finally turns on the master.

5. The method of checking normal input power and load of a programmable AC power distributor at a power-on state by a light signal as claimed in claim 1, wherein the indicator light of the output OFF button is red, and the indicator light of the output ON button is green.

\* \* \* \* \*